United States Patent
Cai et al.

(10) Patent No.: US 7,624,500 B2
(45) Date of Patent: Dec. 1, 2009

(54) PRINTING OF MULTI-LAYER CIRCUITS

(75) Inventors: Xiaorong Cai, Lexington, KY (US);
Michael John Dixon, Richmond, KY (US); Yimin Guan, Lexington, KY (US); Elios Klemo, Lexington, KY (US); Bryan Dale McKinley, Lexington, KY (US); Paul Sacoto, Lexington, KY (US); Jeanne Marie Saldanha Singh, Lexington, KY (US); George Nelson Woolcott, Lancaster, KY (US); Frank Edward Anderson, Sadieville, KY (US)

(73) Assignee: Lexmark International, Inc., Lexington, KY (US)

( * ) Notice: Subject to any disclaimer, the term of this patent is extended or adjusted under 35 U.S.C. 154(b) by 83 days.

(21) Appl. No.: 11/838,992

(22) Filed: Aug. 15, 2007

(65) Prior Publication Data

US 2008/0084449 A1    Apr. 10, 2008

Related U.S. Application Data

(60) Provisional application No. 60/822,526, filed on Aug. 16, 2006.

(51) Int. Cl.
*B41J 2/15* (2006.01)
*B32B 1/00* (2006.01)

(52) U.S. Cl. .................. 29/846; 29/847; 29/830; 29/831; 29/832; 427/11; 427/446; 427/452; 427/96.1

(58) Field of Classification Search .............. 29/846, 29/847, 830, 832, 831; 427/11, 446, 96.1, 427/445, 452; 252/500
See application file for complete search history.

(56) References Cited

U.S. PATENT DOCUMENTS

| 5,600,099 A | * | 2/1997 | Crotzer et al. | 174/257 |
| 2006/0160432 A1 | * | 7/2006 | Silveston-Keith | 439/733.1 |
| 2008/0044634 A1 | * | 2/2008 | Enciu et al. | 428/209 |

* cited by examiner

*Primary Examiner*—Derris H Banks
*Assistant Examiner*—Dan D Le
(74) *Attorney, Agent, or Firm*—Neill R. Kable, Jr.

(57) ABSTRACT

The disclosure relates to circuits and methods for the manufacture of circuits, such as those which avoid the formation of undesirable short circuit paths. One such method maintains a layout area of a fluid composition receiving layer within a layout area of a dielectric layer. Another such method relates to the application of fluid composition receiving layers, conductive layers, and dielectric layers, such as in the provision of printed circuits.

9 Claims, 9 Drawing Sheets

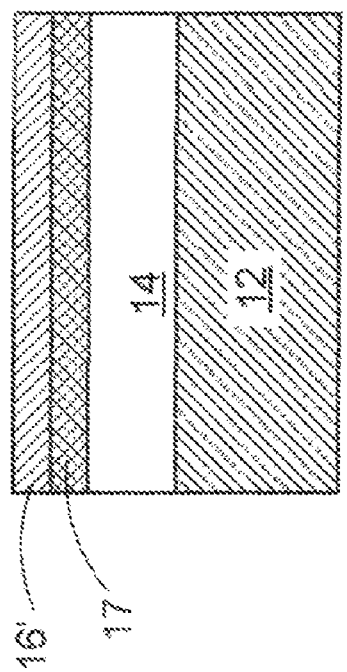
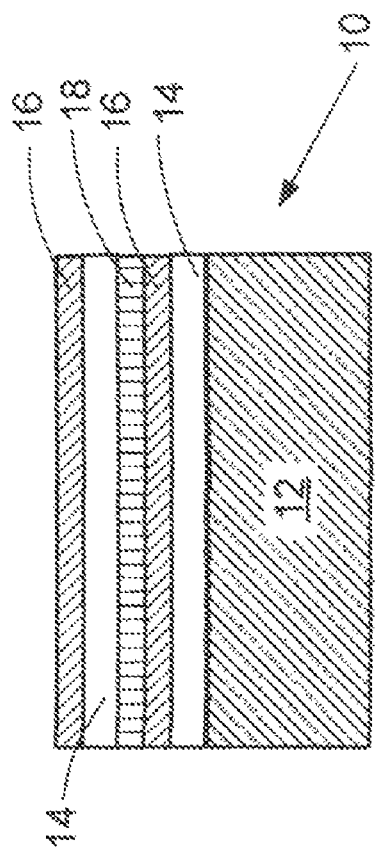

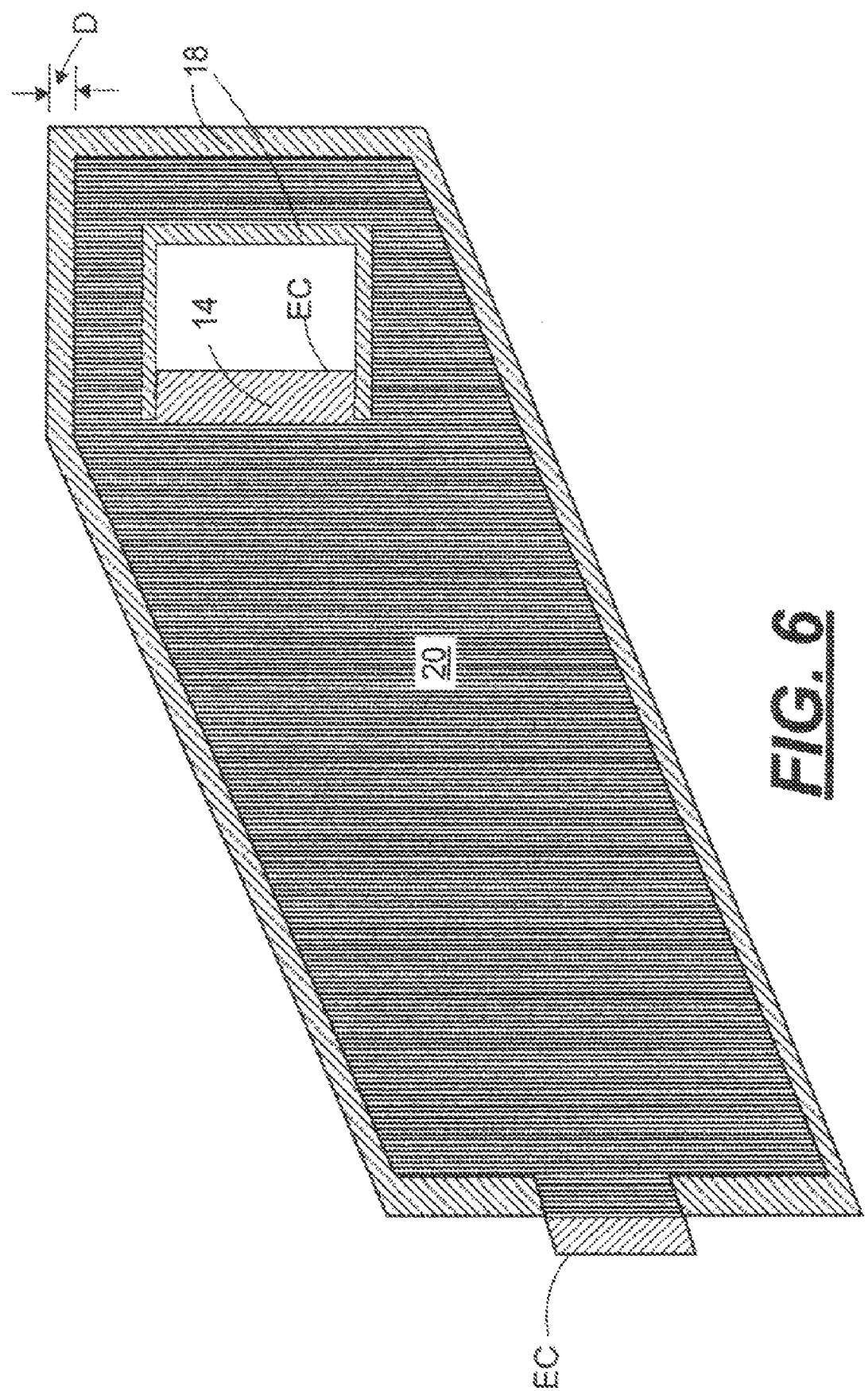

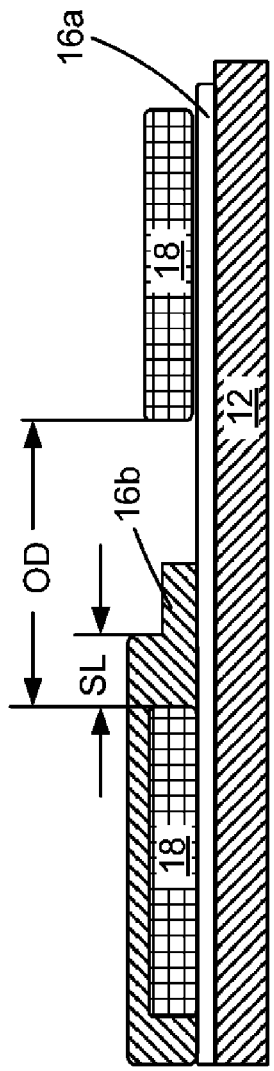
FIG. 7
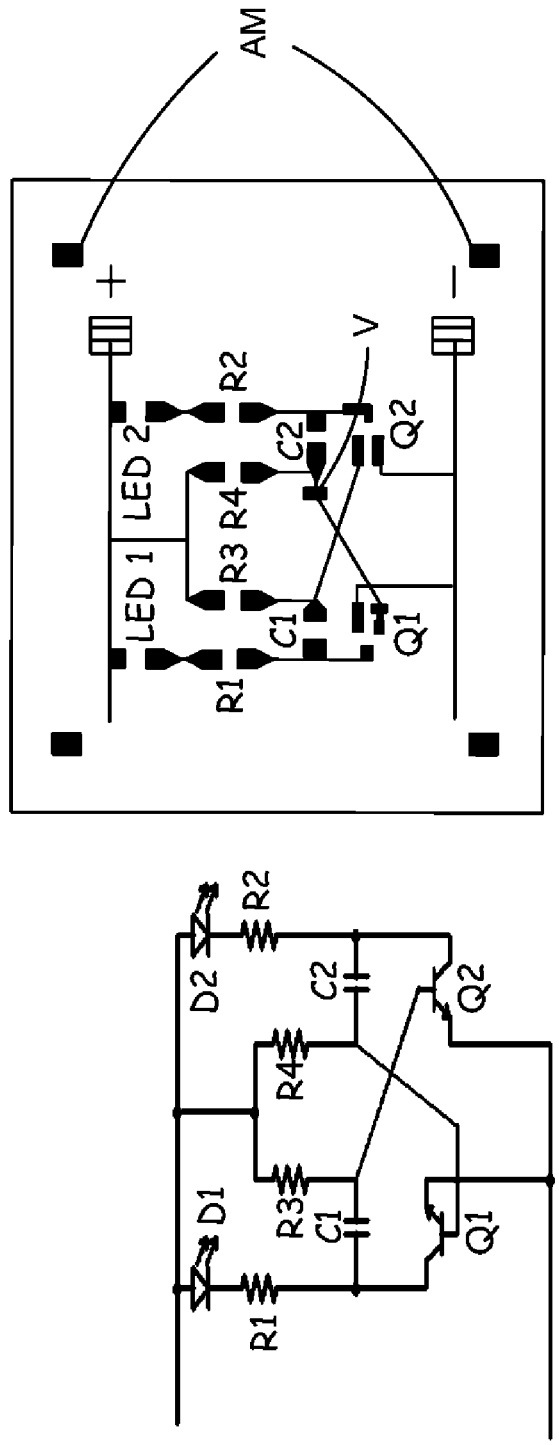
FIG. 8B
FIG. 8A

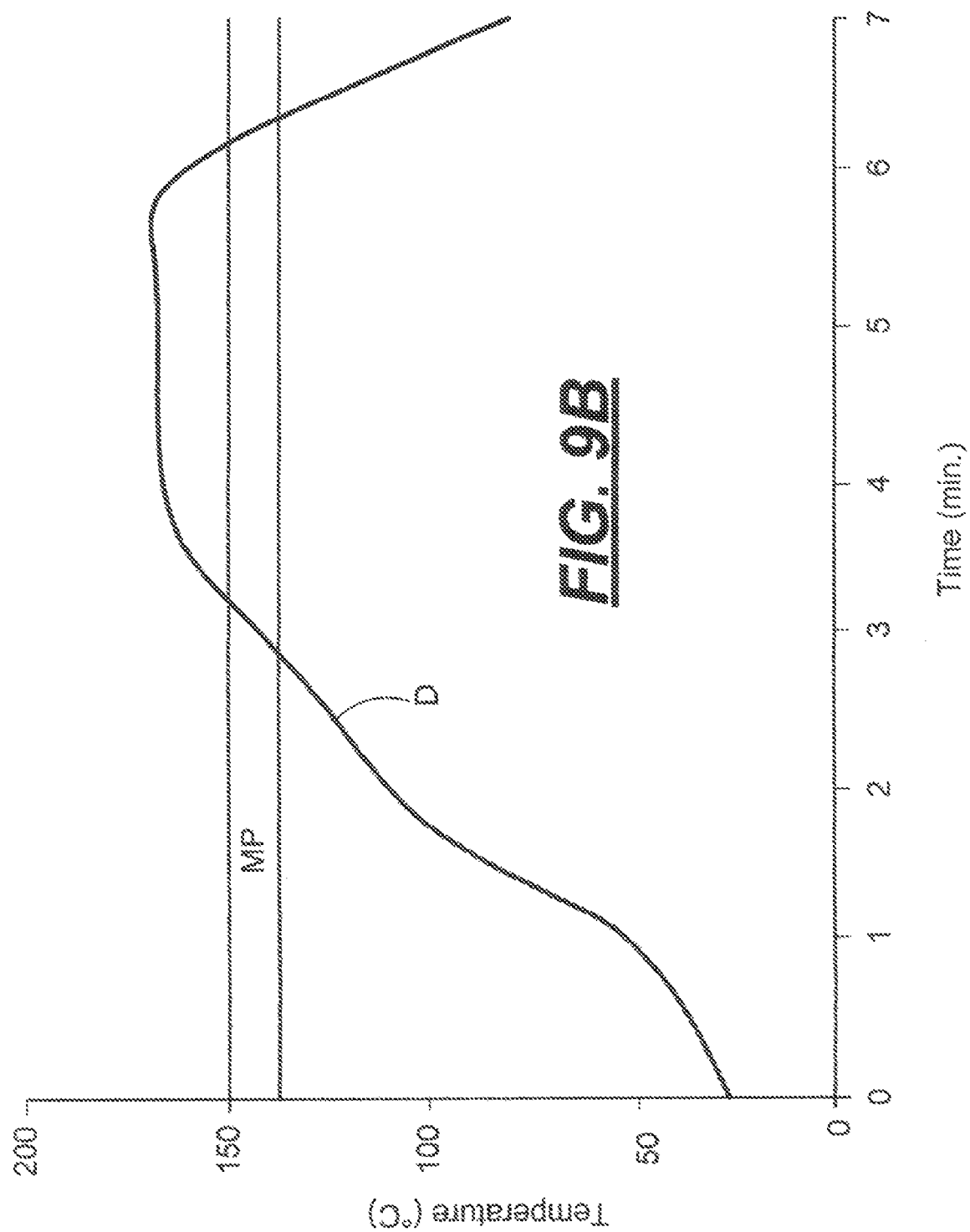

PRINTING OF MULTI-LAYER CIRCUITS

RELATED APPLICATIONS

This application claims priority to provisional 60/822,526 filed Aug. 16, 2006, emitted "PRINTING OF MULTI-LAYER CIRCUITS".

FIELD OF THE DISCLOSURE

The present disclosure is generally directed toward methods for making electrical devices by printing electrical circuit components on a substrate using micro-fluid ejection devices and techniques. More particularly, in an exemplary embodiment, the disclosure relates to improvements in the manufacture of multi-layer printed circuit boards.

BACKGROUND AND SUMMARY

Micro-electronic circuits are typically made using subtractive and additive processes such as photolithography, deposition, plating and etching technologies. These traditional techniques are being replaced by digital fabrication which allows printing layers as needed and reducing materials wastage. One approach has been to provide circuits utilizing fluid ejection devices, such as ink jet printer devices, to print circuits using conductive water based print solutions. However, improvement is desired in the production of printed multi-layer circuit devices.

Multi-layer circuit devices have a plurality of electrically conductive layers applied adjacent to a substrate and separated by insulating dielectric layers. For example, a typical arrangement of layers (sometimes referred to by example as a "stack") has a substrate adjacent to which is applied dielectric layers and conductive layers in an alternating fashion. In the manufacture of printed multi-layer circuits, an ink receiving layer (IRL) is provided on the substrate and between each dielectric and conductive layer. A circuit in a conductive layer is formed on the IRL using a fluid having conductive components therein, such as a water-based fluid composition (which may sometimes be referred to as an "ink") having silver nanoparticles dispersed therein. The dielectric layer insulates the conductive layers from one another and the IRLs handle fluid components (usually water, humectants, dispersants, surfactants, etc) associated with the fluid composition. Conductive traces provide electrical continuity between various electrical components of the circuit according to the circuit design. A number of problems exist in current methods for providing printed circuits, especially in the provision of traces having desirable conductive properties, in the provision of suitable fluid composition receiving layers and ensuring adequate adhesion of the printed circuits to the fluid composition receiving layers, and in the avoidance of the formation of undesirable short circuit paths in the manufacture of circuits.

In one exemplary aspect, the inventors have determined that improvements are needed in the provision of suitable fluid composition receiving layers and ensuring adequate adhesion of the printed circuits to the fluid composition receiving layers. In another exemplary aspect, the inventors have determined that improvements are needed in the manufacture of printed circuits which avoid the formation of undesirable short circuit paths. In yet a further exemplary aspect, the inventors have determined that improved methods for providing circuits by micro-fluid ejection techniques are needed, such as those provided by ink jet printing In one exemplary embodiment, a method is provided for manufacturing a circuit having a substrate having a plurality of layers applied thereto by a micro-fluid ejection device. The layers include at least a fluid composition receiving layer having a layout area and a dielectric layer having a layout area. A first portion of the layout area of the receiving layer is maintained within the layout area of the dielectric layer to avoid undesirable short circuit paths in a first region of the circuit. A second portion of the layout area of the receiving layer is maintained so that it extends beyond the layout area of the dielectric layer to provide a desired electrical path in a second region of the circuit.

In another exemplary embodiment, a method for providing a printed circuit is provided. For example, a first fluid composition receiving layer is ejected adjacent to at least a portion of a surface of a substrate. A first conductive layer is ejected adjacent to at least a portion of the first receiving layer. A first dielectric layer is ejected adjacent to at least a portion of to the first conductive layer. A second fluid composition receiving layer is ejected adjacent to at least a portion of the dielectric layer opposite the first conductive layer. A second conductive layer is ejected adjacent to at least a portion of the second receiving layer.

BRIEF DESCRIPTION OF THE DRAWINGS

Further advantages of exemplary embodiments disclosed herein may become apparent by reference to the detailed description of exemplary embodiments when considered in conjunction with the drawings, which are not to scale, wherein like reference characters designate like or similar elements throughout the several drawings as follows:

FIG. 1 is a cross-sectional view, not to scale, showing the layers of a circuit provided in accordance with an exemplary embodiment of the disclosure;

FIG. 5 is a cross-sectional view, not to scale, showing the layers of a circuit provided in accordance with another embodiment of the disclosure;

FIG. 6 is an enlarged plan view, not to scale, of circuit layout areas for a fluid composition receiving layer and a dielectric layer;

FIG. 7 is a cross-sectional view, not to scale of an exemplary two conductive layer circuit and connecting via therefore;

FIG. 8A is a schematic view of the conductive layers of FIG. 7;

FIG. 8B is a plan view, not to scale, of the circuit of FIG. 7;

FIG. 9B is a graphical representation of a temperature versus time for the soldering process of FIG. 9A.

DETAILED DESCRIPTION OF EXEMPLARY EMBODIMENTS

According to exemplary embodiments of the disclosure, there is provided methods for manufacturing printed multilayer circuits. With reference to FIG. 1, an exemplary multilayer circuit 10 includes a substrate 12, fluid composition receiving layers (FCRL) 14, two or more conductive layers 16, and one or more dielectric layers 18. The one or more dielectric layers 18 can be used to insulate the conductive layers 16 from one another and the FCRL 14 can be used to promote circuit adhesion and handling of solvents (usually water) associated with fluid compositions deposited adjacent to the FCRL. Conductive traces provide electrical continuity between various electrical components of the circuit according to the circuit design.

Figure 2:
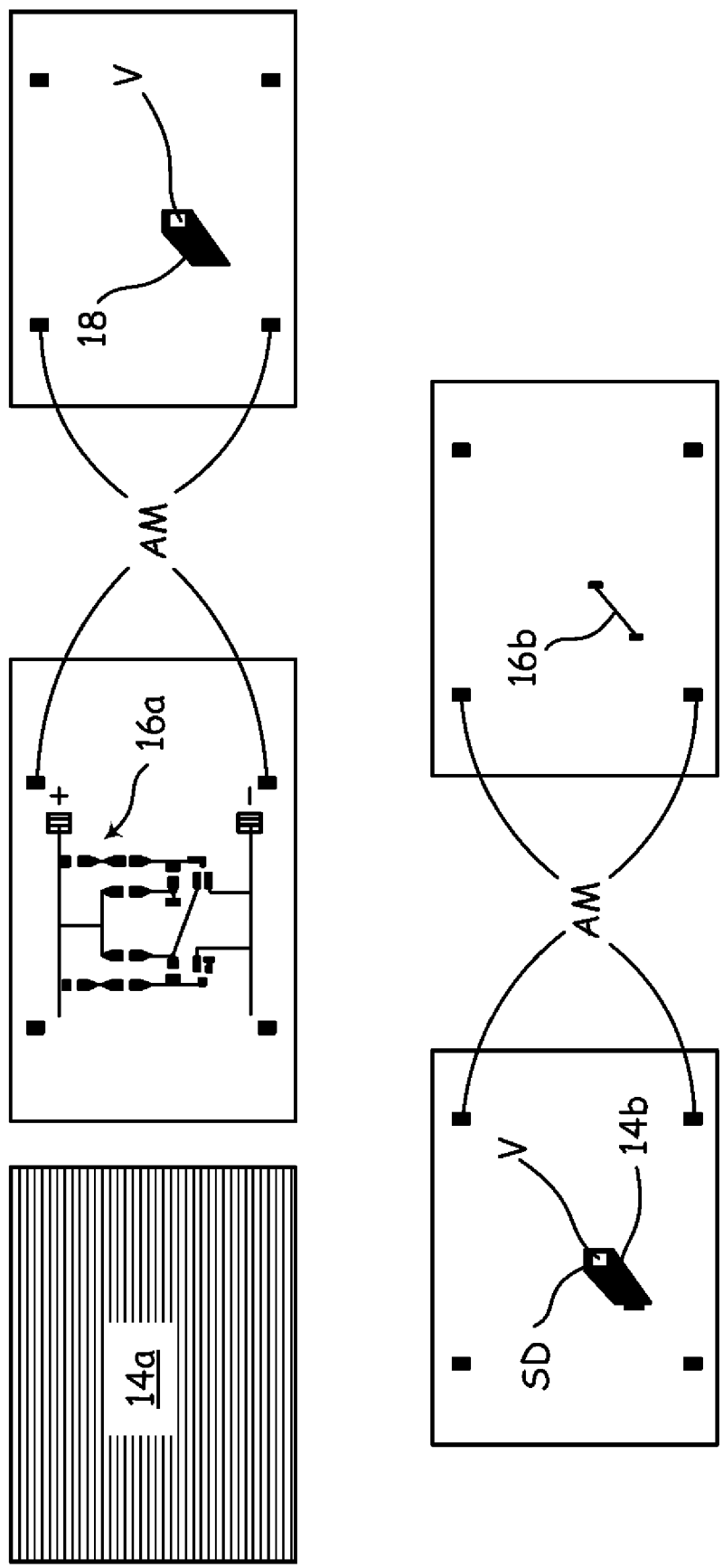
FIG. 2 is a schematic exploded view of various layers of a circuit provided in accordance with an exemplary embodiment of the disclosure.

For the purpose of example, and in accordance with FIG. 2, a circuit may be configured with the substrate 12 (FIG. 1) as a base structure and a first FCRL 14a applied adjacent to the substrate 12. Next a first conductive layer 16a is applied adjacent to at least a portion of the first FCRL 14a. A first dielectric layer 18 is applied adjacent to at least a portion of the first conductive layer 16a, and a second FCRL 14b is applied adjacent to at least a portion of the layer 18. A second conductive layer 16b is then applied adjacent to at least a portion of the second FCRL 14b. As will be appreciated, features, such as vias or step downs or other electrically conductive paths, may be provided between the layers to provide desired electrical connectivity. The designations "a" and "b" reference discrete ones of the referenced layers, it being understood that the below descriptions of the FCRL 14 corresponds to the layers 14a and 14b, and the descriptions of the conductive layer 16 corresponds to the layers 16a and 16b.

The various micro-fluid jet printable compositions described herein that are used to provide the various layers desirably have a viscosity that permits micro-fluid jet printing. Thus, the compositions may have a viscosity of about 1 to about 20 centipoise at 25° C. Suitable average ejection head temperatures may include, for example, ejection heads having temperatures of less than or equal to about 60° C., although higher temperatures may also be used.

Typically, when dispersed particles are included in a micro-fluid jet printable composition, the composition may include from about 5 up to and including 60 percent by volume particles or more, based on the total volume of the carrier fluid and particles. In some implementations, the quantity of particles is at least 10 percent by volume, often at least 30 percent by volume particles, and typically less than or equal to 60 percent by volume, based on the total volume of particles and carrier fluid in the first composition. The particles may be nano-sized particles generally having a diameter ranging from about 0.5 nanometers to about 3 microns.

Particle size refers to the number average particle size and is measured using an instrument that uses transmission electron microscopy or scanning electron microscopy. Another method to measure particle size is dynamic light scattering, which measures weight average particle size. One example of such an instrument found to be suitable is available from MicroTrac Inc. of Montgomeryville, Pa. under the trade name MICROTRAC UPA 150.

A potential advantage of using micro-fluid ejection heads to deposit the various layers of the circuit on a substrate is that such printing techniques enable the layers to be precisely deposited without potentially damaging or contaminating the substrate. Micro-fluid jet printing is a non-contact printing method, thus allowing the circuit materials to be printed directly onto substrates without damaging and/or contaminating the substrate surface due to contact, as may occur when using screens or tools and/or wet processing techniques during conventional patterning, depositing, and etching. Micro-fluid jet printing also provides a highly controllable deposition method that may provide precise and consistently applied material to the substrate. Micro-fluid ejection heads for depositing the conductive layer fluids may be selected from ejection heads having thermal actuators, piezoelectric actuators, electromagnetic actuators, and the like.

Devices and articles that may be made according to embodiments of the disclosure include transistors, diodes, capacitors (e.g., embedded capacitors), and resistors. The foregoing components may be used in various arrays to form amplifiers, receivers, transmitters, inverters, oscillators, electroluminescent displays and the like.

A circuit having the conductive layer 16 may be formed on the substrate 12 by printing traces using a fluid having conductive components therein, such as aqueous-based solutions or "inks" having conductive nanoparticles dispersed therein. The first conductive layer 16a may have a thickness ranging from about 1 to about 2 microns, and subsequent conductive layers, such as the layer 16b, may have a thickness ranging from about 2 to about 4 microns. An example of a composition suitable for providing the conductive layer 16 includes from about 10 to about 20 wt. % conductive particles, (for example, silver nanoparticles available from Nippon Paint America, Inc.), from about 5 to about 15 wt. % 2-pyrrolidone; from about 5 to about 15 wt. % glycercol; from about 0.1 to about 1.0 wt. % of a surfactant or wetting agent (such as SURFYNOL 465); and the remainder water or other carrier fluid.

The conductive particles may be chosen from a variety of conductive materials, where the particles are dimensioned to flow through the passageways of micro-fluid jetting heads, and generally have a size dimension ranging from about 10 and 200 nanometers. The carrier fluid in which the particles are dispersed may be organic or inorganic, polar or non-polar. For the purpose of example, the carrier fluid is an aqueous-based fluid, but solvent based fluids may be used for micro-fluid ejection heads such as those using piezoelectric actuators. Exemplary conductive inks include silver ink, copper ink, and gold inks available from Nippon Paint America, Inc. and Cima NanoTech, Inc., and combinations thereof.

The dielectric layer 18 may be applied by printing solutions or "inks" which have a relatively low dielectric constant. The dielectric layer 18 may have a bulk resistivity of greater than about $10^{14}$ ohm-cm. Typically, the thickness of the dielectric layer 18 will range from about 15 to about 30 microns. The dielectric layer may be formulated from a variety of polymeric material such as acrylics, epoxies, urethanes, silicones, polyimides, etc. The low dielectric polymeric materials may be mixed, dispersed, suspended, slurried, or emulsified in a carrier fluid. The carrier fluid may be selected from water or solvent with water being a particularly useful carrier fluid. In the cases of epoxies or urethanes where a cross linking thermosetting reaction must take place between component "a" and component "b", component "a" and component "b" may be mixed in situ on the substrate using two inks from two separate ejection heads, or they may be provided in a single head with the reactive groups on one of the two components blocked with a thermally de-blockable agent such that the application of heat can initiate a reaction between the two components.

The substrate 12 may be a substrate of the type used in the manufacture of electrical circuit devices, such as epoxy substrates, polyimide substrates, polyethylene terephthalate (PET) substrates, and the like. A suitable substrate is an epoxy FR4 grade circuit board, which is a fire rated electrical-grade, dielectric fiberglass laminate epoxy resin system combined with a glass fabric reinforcing material. In the designation "FR4," the F stand for "flame," the R stands for "retardancies," and the 4 means a #4 epoxy. In general, these substrates 12 have glass transition temperatures in the range of from about 125° to about 165° C. For this application, the thickness of the FR4 epoxy board was 0.8 mm.

It has been observed that the substrate 12 is typically made of materials that make the substrate 12 relatively non-absorptive. This non-absorptive property is disadvantageous for forming conductive traces thereon using aqueous-based printing solutions since components in the printing solution that do not contribute to the conductivity of the trace need to be decomposed or evaporated from the printing solutions. For example, printing a conductive layer composition such as the one described herein on glass substrates requires a sintering temperature above about 250° C. to obtain traces with acceptable conductivity or resistivity properties. Lower sintering temperatures may result in poor conductivity caused by residual non-conductive materials remaining within the trace. Thus, relatively high temperatures are required for sintering and annealing the conductive metal, evaporating higher boiling materials, and/or decomposition of non-evaporative components present in the conductive layer composition. In the case of traditional circuit substrate materials such as FR4, the processing temperature range for such materials is much below 250° C. thus dictating the need for an alternate method of handling the non-conductive components of the printing solutions.

Therefore, one purpose served by the FCRL 14 is to absorb at least a portion of the components associated with the aqueous-based print solution that are not essential to the conductivity of the conductive layers 18. It is desirable that the FCRL 14 have sufficient capacity to at least absorb the non-volatile fluids and non-decomposable materials in the printing solution at the temperature used to process the circuit and form the conductive layers 18.

Prior to application of the FCRL 14 to the substrate, it is desirable to treat the substrate with a water based surface treatment solution (which in an exemplary embodiment may sometimes be referred to as an "ink"). The surface treatment solution may include about 3 wt. % surfactant composition and the remainder water. The surfactant composition may be, for example, a mixture of a siloxane surfactant such as SILWET 7600 available from Union Carbide, and a nonionic wetting agent such as SURFYNOL 465, available from Air Products. The surfactant composition may include about 2 wt. % of the SILWET 7600 surfactant, 1 wt. % of the SURFYNOL 465 wetting agent, and the remainder water.

An exemplary material for providing the FCRL 14 may be provided by a composition having particles dispersed in a binder in an aqueous-based solution (which in an exemplary embodiment may sometimes be referred to as an "ink"). The solution may be applied, for example, by use of micro-fluid printer or other fluid ejection device and dried by evaporation. The FCRL 14a applied to the substrate 12 may have a thickness ranging from about 10 to about 25 microns, and any subsequent FCRL, such as layer 14b, may have a thickness ranging from about 10 to about 15 microns.

The particles dispersed in the binder providing FCRL 14 may include a pigment dispersion wherein the pigment is selected from, but not limited to, inorganic metal oxides, clays, carbonates, synthetic materials, and combinations of two or more of the foregoing. The inorganic metal oxide pigments may be selected from, but not limited to, fumed, colloidal, and precipitated metal oxides. The colloidal metal oxides which may be used may be partially aggregated or structured metal oxides of silicon, aluminum, titanium, and the like.

The binder may be selected from, but not limited to, dispersed and solution polymers. Specific examples of binders include, epoxies, urethanes, acrylics, starches, proteins, and polyhydric compounds. Of the foregoing, a particularly suitable binder is an acrylic latex binder. Without being bound by theory, it is believed that the dispersed particles in the FCRL 14 function to provide porosity for absorbing water, and non-volatile components of the printing solutions containing the conductive materials printed on the substrate 12. The binder serves to provide adhesion of subsequent printed layers to the FCRL 14.

An exemplary composition suitable for use as the FCRL 14 may include from about 5 to about 10 wt. % of colloidal silica; from about 1 to about 10 wt. % of an acrylic binder; from about 3 to about 10 wt. % 2-pyrrolidone; from about 3 to about 10 wt. % polyethylene glycol; from about 0.5 to about 2.0 wt. % 1-2 hexanediol; and the remainder water.

An example of a suitable colloidal silica is the SNOWTEX-PSM series of colloidal silica produced by Nissan Kagaku Kogyo, Co., Ltd., with the SNOWTEX-PSM series having an average particle size in the connected state of approximately 120 nm being particularly suitable. An example of a suitable polyethylene glycol is PEG 400 available from Mallinckrodt Baker, Inc.

Dispersing agents which may be used to disperse the conductive particles and/or the pigment dispersion in a carrier fluid include, but are not limited to, polymeric dispersants having ionic hydrophilic segments and nonionic hydrophilic segments. For example, an acrylic polymer that is a random, co- or ter-polymer made through free radical polymerization may be used as a dispersant. The molecular weight of such a polymer, which is not critical, may be controlled by a chain transfer agent. However, too high a molecular weight may result in an increase in the viscosity of the fluid and too low a molecular weight may reduce the stability of the dispersion. A suitable molecular weight for the dispersing agent is in the range of from about 8,000 to about 10,000 weight average molecular weight as determine by GPC analysis. Examples of suitable dispersing agents include, but are not limited to, a random copolymer of methacrylic acid and polyethylene glycol methacrylate, and a co-polymer of methacrylic acid and tris(polyethyleneglycol)-2,4,6-tris 1-phenyl ethyl phenyl ether methacrylate. Methods for making a dispersing agent are disclosed in United States Pub. No. 2006/0098069, the relevant disclosure of which is incorporated herein by reference. Self-dispersing conductive particles may also be used with the carrier fluid in the absence of the foregoing dispersing agent.

In accordance with one exemplary embodiment of the disclosure, a method of deposition of materials during formation of a circuit, such as the circuit 10, has been devised that may provide traces in the conductive layers 16 having higher conductivity as compared to the conductivities of traces in circuits formed by conventional printing techniques.

In accordance an exemplary method for providing a circuit with traces having improved conductivity, the substrate 12 is cut into a desired dimension and cleaned, as by use of isopropyl alcohol and chemical wipes of the type commonly used to clean circuit boards. Next, the substrate 12 is treated with a water based surface treatment solution, such as the surface treatment solutions described above containing about 3 wt. % surfactants and the remainder water. This may be accomplished by applying the treatment solution to the device side of the substrate, and wiping the treatment solution from the substrate using a chemical wipe, and repeating the treatment. The FCRL 14 may then be applied adjacent to the treated surface of the substrate 12. For the purpose of example, a method that may be used to apply the FCRL 14 adjacent to the substrate 12 is set forth below:

---
Print 720,000 dots per square inch (~24 pL/drop) of the FCRL adjacent to the treated substrate.
Dry for 120 seconds under 150 watt heat lamp spaced 100 mm away.
Repeat to achieve desired thickness/resistivity.
Place substrate with thus applied FCRL in an oven in accordance with the following heat ramp cycle:
  Ramp 5° C. per minute to 80° C., hold for 30 minutes.
  Ramp 5° C. per minute to 100° C., hold for 30 minutes.
  Ramp 5° C. per minute to 120° C., hold for 30 minutes.
  Ramp 5° C. per minute to 150° C., hold for 30 minutes.
  Cool at a rate of 5° C. per minute to ambient temperature.
---

Once the FCRL 14 has been provided, the conductive layer 16 may be applied adjacent to the FCRL 14. For the purpose of example, a method that may be used to deposit the conductive layer 16 adjacent to the FCRL 14 is set forth below:

---
Print the conductive traces adjacent to the FCRL 14 at 720,000 dots per square inch (~24 pL/drop) coverage.
Place in an oven in accordance with the following heat ramp cycle:
  Ramp 5° C. per minute to 80° C., hold for 30 minutes.
  Ramp 5° C. per minute to 150° C., hold for 30 minutes.
  Cool at a rate of 5° C. per minute to ambient temperature.
---

Figure 3:
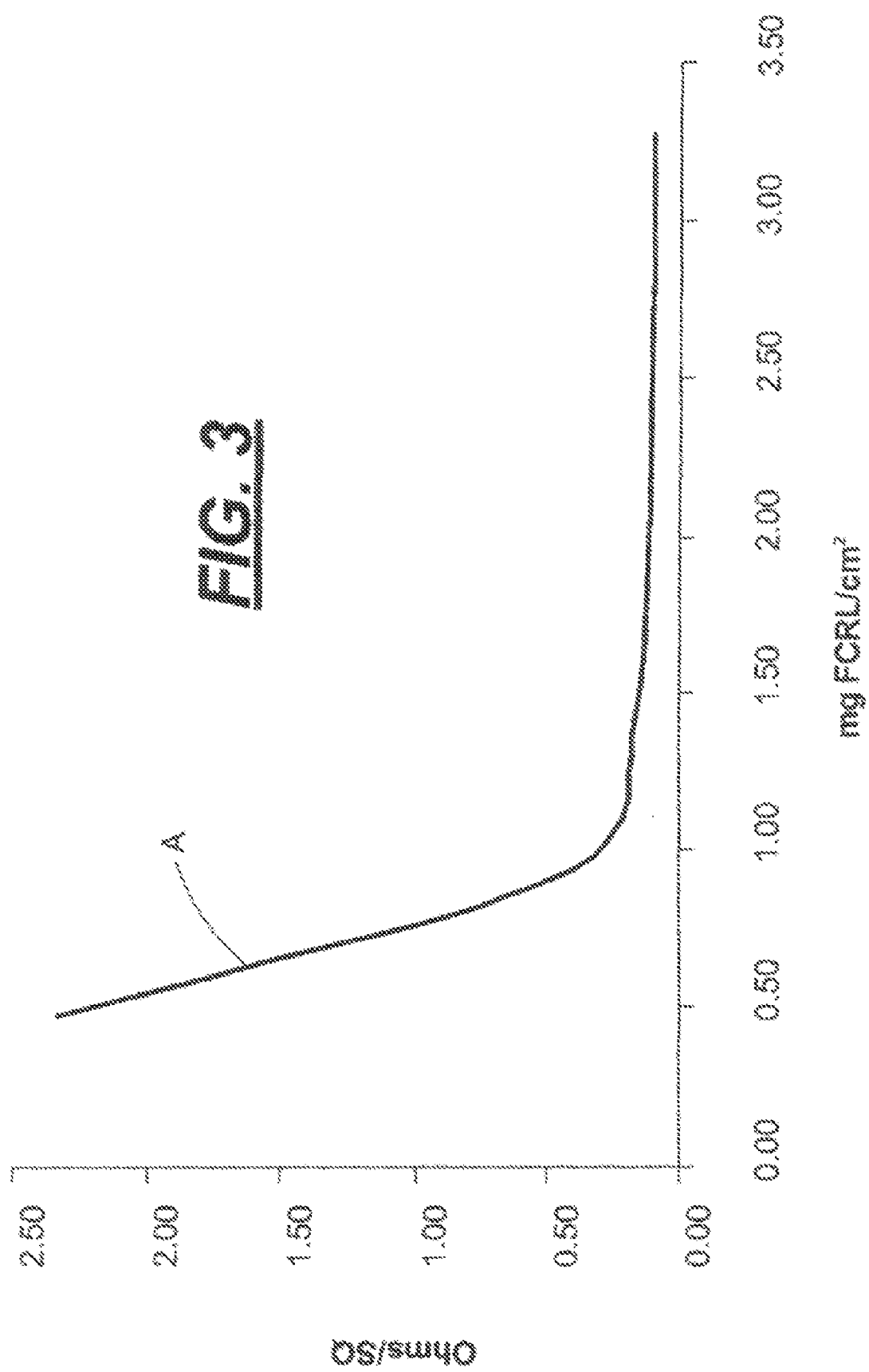
FIG. 3 is a graphical illustration of the effect of a coating weight of a fluid composition receiving layer versus specific surface resistivity provided by the receiving layer.

The conductivity of the traces of the conductive layer 16 may be determined as by use of a sheet resistivity meter. With reference to FIG. 3, there is a graph showing the effect of the coat weight of the FCRL 14 in terms of the weight of dry FCRL (binder and pigment) versus the specific surface resistivity of the conductive trace. The data illustrated by Curve A was for the average of two conductive traces of 1 mm by 15 mm on two different substrate board. The substrate 12 used for this example was epoxy FR4 grade circuit board. The substrate 12 had the above described surface treatment, FCRL 14, and silver conductive layer 16 as described above.

Figure 4:
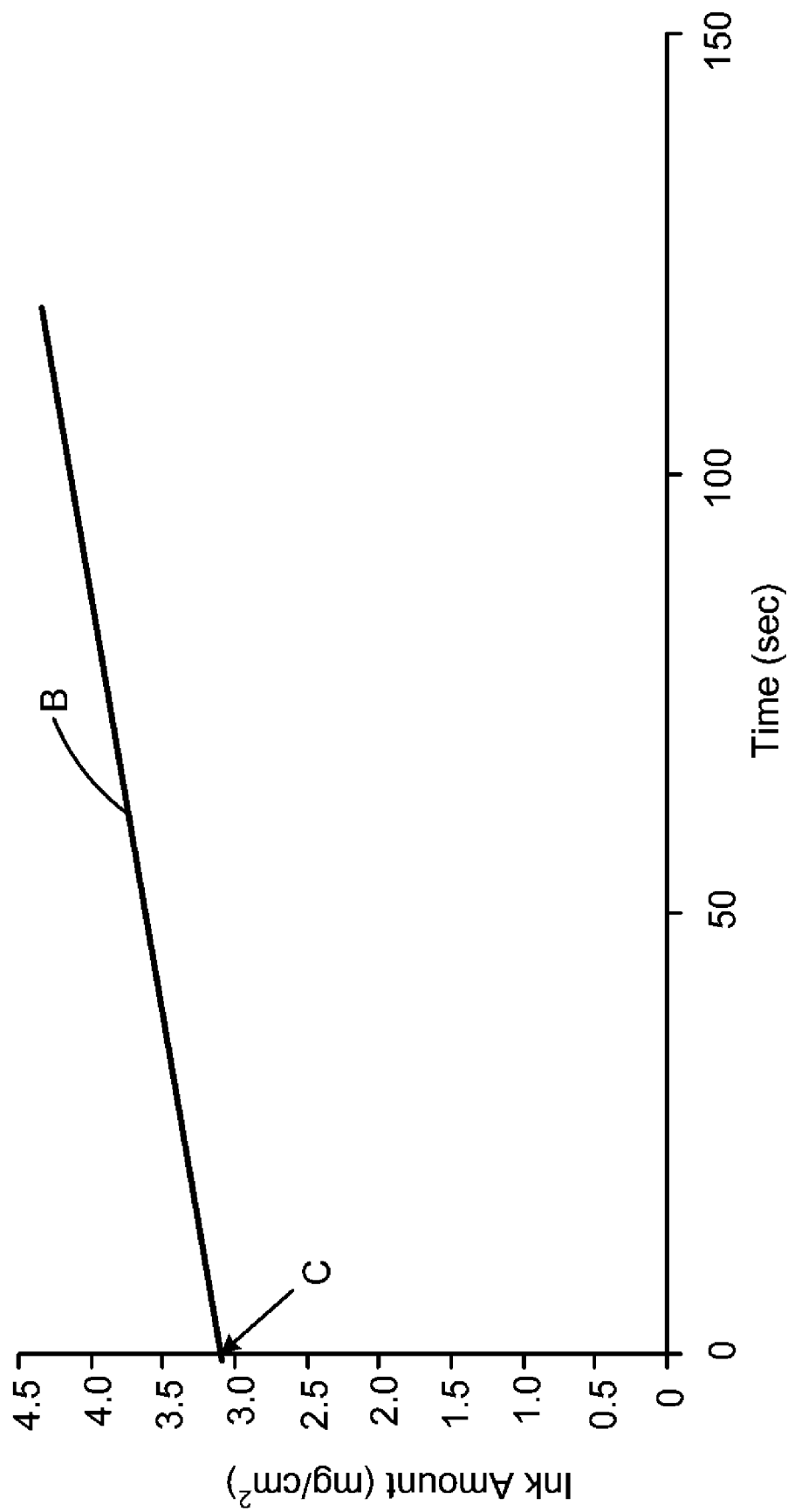
FIG. 4 is a graphical illustration of fluid versus drying time in seconds for secondary absorption of fluid on a substrate.

The dry FCRL may be characterized by a visual dry time technique to determine the instant absorption capacity (IAC). By this method, increasing amounts of a test fluid are printed on the FCRL at constant area coverage. The test fluid is comprised of the liquid components from the conductive ink (everything but silver particles and dispersing agent). Visual dry time is recorded at the point when there is no longer observable surface reflectance from the test fluid. An absorption graph is generated by plotting the recorded visual dry time against the amount of test fluid per unit area as shown in FIG. 4. It is believed that in a microporous substrate such as the FCRL 14 the absorption in the area directly below the printed pattern takes place in the order of milliseconds or less depending on the fluid amount and substrate capacity. After the accessible pores are filled, a secondary and slower absorption takes place and can go on for several seconds even minutes as shown by the curve B in FIG. 4. The secondary absorption event is comprised of fluid absorption parallel to substrate plane, penetration into small or secluded pores, diffusion into swellable components, and evaporation. Since the visual dry time technique does not have the time resolution to extract information about the initial microporous absorption, only the secondary absorption profile is used to obtain the IAC as shown by point C on FIG. 4. Thus, the IAC (Point C) is obtained by extrapolation to time=0 of the secondary absorption profile (Curve B) recorded by visual dry time. By this technique, a non-absorbing substrate has 0 mg/cm$^2$ IAC whereas the dry FCRL 14 has an IAC ranging from about 0.1 to about 5.0 mg/cm$^2$, typically about 0.6 mg/cm$^2$.

As will be noted from the Curve A of FIG. 3, resistivities as low as about 0.1 ohms per square were obtained using methods and materials described herein. The numerical information of FIG. 3 is set forth below:

| mg/cm$^2$ | Ohms/square |
|---|---|
| 0 | 1200000 |
| 0.47 | 2.33 |
| 0.94 | 0.40 |
| 1.41 | 0.17 |
| 1.87 | 0.12 |
| 2.34 | 0.12 |
| 2.81 | 0.10 |
| 3.28 | 0.10 |

It has been observed that processes that fail to use the FCRL 14 or the process steps described herein or both may yield substantially higher resistivities, with the lowest resistivity obtainable being about 1,200,000 ohms per square. In this regard, it is noted that the "0 mg/cm$^2$" corresponds to a conventional direct printing method having no FCRL wherein the circuit is printed directly on the substrate.

In accordance with another exemplary embodiment of the disclosure, it has been observed that the conductive layers 16 that provide the traces do not generally adhere well to the substrate 12 or the FCRL 14.

Furthermore, it has been observed that such conductive traces may detach from the FCRL 14 during heat reflow soldering of external circuit components such as resistors, capacitors, LED's and the like. Such detachment may result in diminished trace conductivity and/or no conductive pathway across components. Thus, it was decided to improve the adhesion of the conductive traces to the FCRL 14 during the solder reflow, such as in order to secure proper component attachment and maintain trace conductivity.

In an exemplary embodiment of the disclosure, adhesion of the conductive traces may be improved by a gradient approach to application of the FCRL 14 and the conductive layer 16 to the substrate 12. In this method, as represented in FIG. 5, the FCRL 14 is deposited adjacent to the substrate 12 as previously described, after which material for the conductive layer 16 (e.g., silver ink) and material used for the FCRL 14 are substantially simultaneously applied adjacent to the FCRL 14 to provide a gradient layer 17. Following deposition of the gradient layer 17, an upper conductive layer 16' is applied adjacent to the gradient layer 17 as previously described for the conductive layer 16. For example, the gradient layer 17 may be applied with two 24 pL/drop printheads, applying 360,000 dots per square inch substantially simultaneously of the conductive ink and the FCRL. Suitably the gradient layer 17 is dried, as by application of a heat lamp, prior to application of the upper conductive layer 16' adjacent to the gradient layer 17. Drying may be accomplished as by application of, but not limited to, a heat lamp (150 watt, 100 mm spacing) for 30 seconds.

A test was performed to assess the adhesion of the conductive traces to emulate the conditions of soldering circuit components. Heat was applied to solder paste in contact with the conductive trace using a 300° C. heat gun at a distance of 10 mm until reflow of the solder was observed. Adhesion was considered acceptable if the conductive trace stayed adhered to the FCRL 14 throughout the solder reflow process and the trace maintained conductivity.

For the purpose of example only, the following are examples of gradient formulations 17 under different drying conditions on a circuit having a substrate 12, a FCRL 14, and an upper conductive layer 16'. The comparative example was prepared as previously described, wherein the conductive layer 16 was applied directly to the FCRL 14 (with no gradient layer 17).

such in a connection via or at the edge of a dielectric layer where a conductive trace may step off of the dielectric layer, it is desirable to have the material of the FCRL present to provide fluid handling capabilities.

With reference to FIG. 6, it will be seen that the FCRL 14 layout area is substantially within a layout area of the dielectric layer 18, except at locations where a connection is desired between the conductive layers 16a and 16b. A difference in the FCRL 14 layout area and the dielectric layer 18 layout

| Gradient Layer 17 | INK | Comparative example | Example 1 | Example 2 | Example 3 |
|---|---|---|---|---|---|
| Head 1 Dot count/SQ. inch | Silver Ink | | 360,000 | 360,000 | 720,000 |
| Head 2 Dot count/SQ. inch | IRL Ink | | 360,000 | 360,000 | 720,000 |
| Dry In between Layers | | NA | YES | NO | YES |
| Top Conductive Layer 16' | | | | | |
| Head 1 Dot count/SQ. inch | Silver Ink | 720,000 | 720,000 | 720,000 | 360,000 |
| Head 2 Dot count/SQ. inch | None | | | | |
| Measurements | | | | | |
| Resistivity before Soldering | | 0.102 | 0.225 | 0.458 | 46 K-M |
| Soldering Test | | Fail Trace Adhesion | Pass | Fail Alloy Adhesion | Fail Alloy Adhesion |
| Resistivity after Soldering | | OL | 0.225 | 0.670 | 4 K-M |

The comparative example shows good initial resistivity prior to soldering. The adhesion is lost during soldering rendering an open circuit.

Example 1 shows acceptable alloy adhesion and resistivity before and after soldering.

Example 2 shows the effect of drying between layers on alloy adhesion and resistivity. If there is inadequate drying between layers, as shown in Example 2, the initial resistivity is higher than the comparative example, as well as Example 1, and there is poor alloy adhesion during the reflow. Soldering further increases resistivity.

Example 3 shows the effect of the amount of gradient materials on the alloy adhesion and resistivity. In this example, there is an excess of gradient materials and, as a result, there is very high resistivity initially and poor alloy adhesion during soldering, rendering this system unacceptable.

It was also observed that increasing the amount of conductive nanoparticles in the conductive fluid composition and/or increasing the dots per inch of conductive fluid composition deposited for the traces did not improve adhesion. Several materials such as silane coupling agents, alternate solder alloys and soldering processes were also unsuccessful in providing trace adhesion.

In accordance with yet another aspect of the disclosure, it has been observed that misalignments of the FCRL 14 and the substrate 12 or dielectric layer 18 may lead to undesired short circuit pathways that disadvantageously affect the performance of the circuits. In addition, it has been observed that migration or flow of the FCRL 14 may occur prior to coring or fixation of the FCRL 14, such that portions of the FCRL 14 spread beyond the edges of the dielectric layer 18 and lead to short circuit pathways. Also, short circuit pathways may exist laterally through the FCRL 14 over the top of the dielectric layer 18.

It has been discovered that maintaining the geometry of the FCRL 14 within predetermined relationships relative to the geometry of the dielectric layer 18, except at locations where electrical paths are desired, can help to avoid undesirable short circuit paths. At the locations of desired electrical paths, area (D) may range from about 30 microns or more in any two-dimensional direction. At location EC, which is a step down electrical connection location for connecting the conductive layers 16a and 16b to one another, the FCRL 14 extends beyond the dielectric layer 18 a distance of from about 30 microns or more. The area of overlap of the FCRL 14 and 18 in FIG. 6 is shown as the shaded area 20. The layout area (D) and the step down at location EC of about 30 microns is dependent on the droplet size of fluid, accuracy of placement of droplets on the substrate to provide layers 14 and 18, drying speed of the layers 14 and 18 and rheological properties of the fluids used to provide the FCRL 14 and the dielectric layer 18. Hence the layout area D and step down EC may be less than 30 microns for certain fluids, droplet, sizes, and droplet placement accuracy. Likewise, the layout areas D larger than about 30 microns may be used depending on available spacing between adjacent conductive layers.

Using the various embodiments described herein, a process for fabricating a multi-layer printed circuit board using an aqueous-based system was achieved. The following Example 4 provides an illustration of a successfully functioning two layer printed circuit board constructed in accordance with the exemplary embodiments:

Example 4

Using thermal inkjet technology in conjunction with aqueous-based fluids, a functional two-metal layer circuit was constructed on an epoxy F-4 board (0.8 m thick). The circuit successfully functioned when powered by a 9 volt battery applied to cathode and anode terminals thereof, causing light emitting diode components of the circuit to flash in an alternating pattern.

Returning to FIG. 2, and with additional reference to FIGS. 7, 8A and 8B, the circuit was fabricated on a substrate 12, and included a first conductive layer 16a and a second conductive layer 16b, applied on a first FCRL 14a and a second FCRL 14b, respectively. Dielectric layer 18 was provided to isolate the conductive layers 16a and 16b from one another. The various layers were applied using a micro-fluid jet printer and aligned using alignment marks AM. The connection between the conductive layers 16a and 16b is made through a via V and a step down feature SD, having an opening in the dielectric layer OD ranging from about 1 to about 2.5 millimeters, and a step down length SL ranging from about 0.05 to about 0.5 millimeters, as shown in FIG. 7. The FCRL 14 is not shown in FIG. 7 for clarity of the presented features, it being understood that the FCRL 14 was provided as described herein. FIG. 8A is a schematic drawing of an exemplary circuit made according to the disclosure, and FIG. 8B is a plan view of an actual circuit containing surface mounted circuit components as indicated.

The circuit components are identified in FIGS. 8A and 8B as follows:

| Reference | Component |
|---|---|
| LED1 | Light emitting diode |
| LED2 | Light emitting diode |
| R1 | Resistor |
| R2 | Resistor |
| R3 | Resistor |
| R4 | Resistor |
| C1 | Capacitor |
| C2 | Capacitor |
| Q1 | Transistor |
| Q2 | Transistor |

Figure 9A:
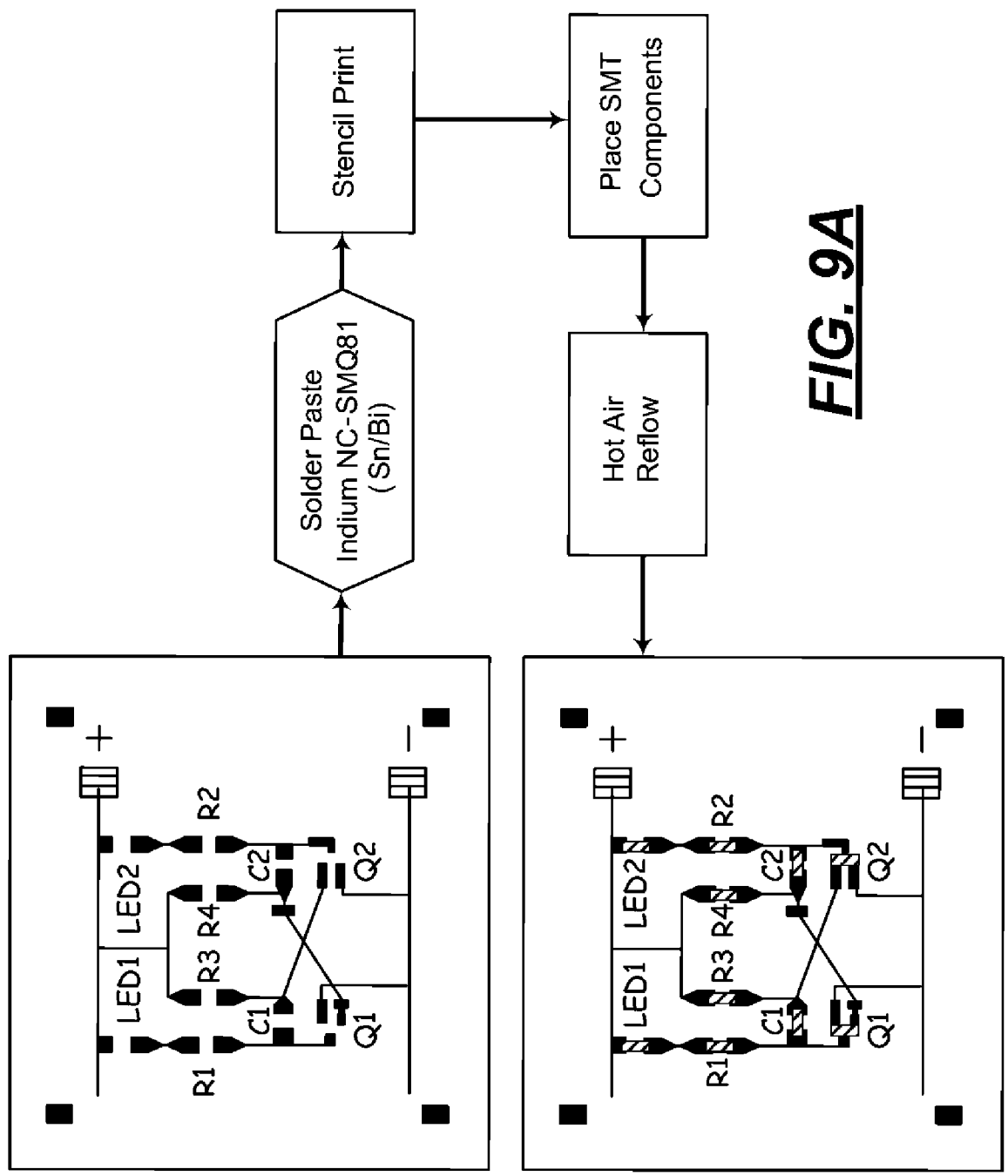
FIG. 9A is a process flow diagram for soldering external circuit components onto the circuit of FIG. 7.

The surface mounted circuit components were placed and soldered to the circuit using a solder paste in a reflow oven process as illustrated in FIG. 9A. A suitable solder paste is a Sn/Bi paste available from Indium Corp. of Utica, N.Y. under the trade name INDIUM NC-SMQ 81. The solder paste was applied by a stencil printing process and the components were located on the circuit by a computer automated process. The reflow oven was operated at an oven temperature of from about 170° to about 180° C., with a residence time of from about 30 to about 160 seconds, as seen by the temperature versus time profile of curve D provided in FIG. 9B. The melting point (MP) range of the solder is indicated in FIG. 9B.

Figure 10:
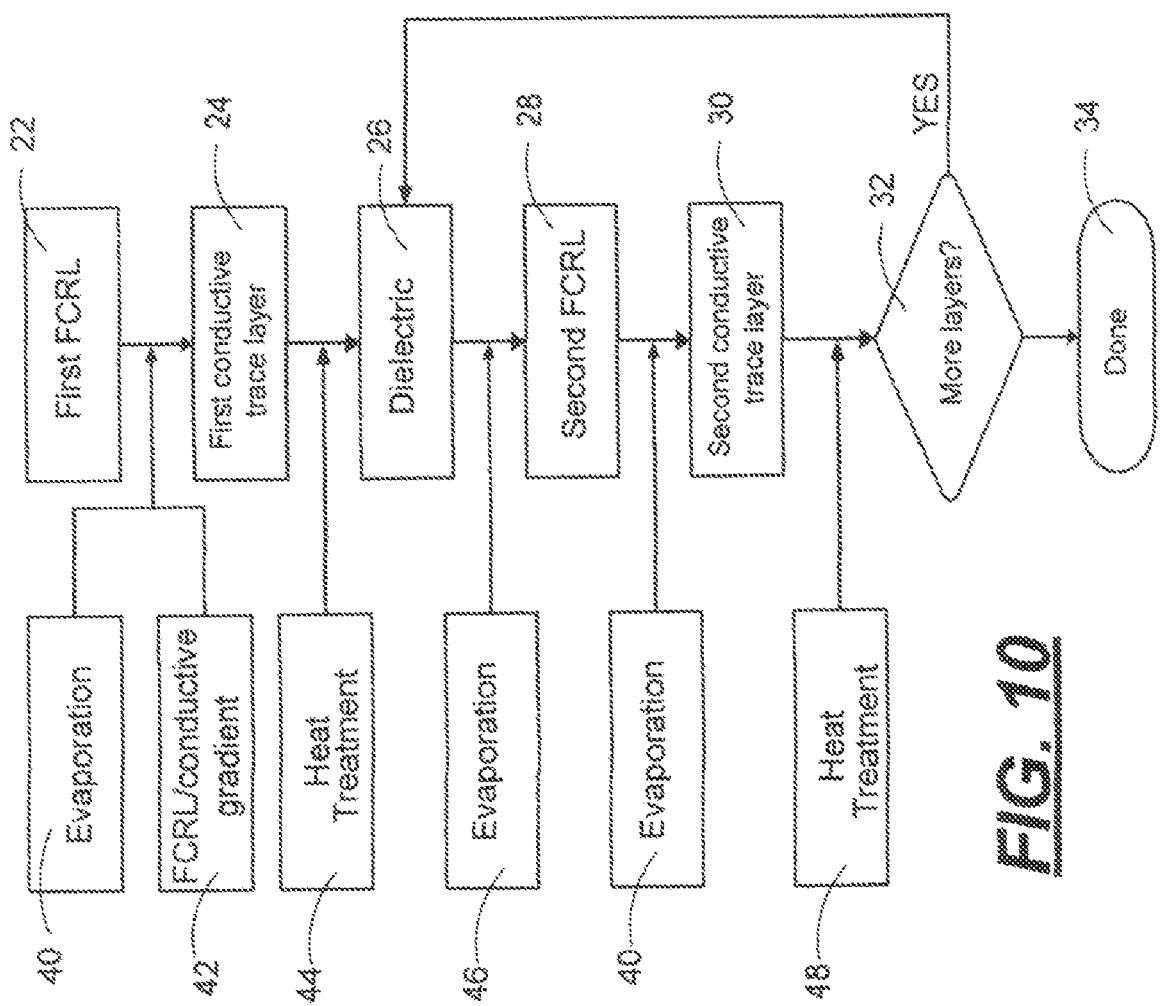
FIG. 10 is a process flow diagram for priming circuits according to an exemplary embodiment of the disclosure.

Primary process steps that were used in Example 4 are set forth in the right-hand column of FIG. 10 and optional steps are set forth in the left-hand column. As will be seen, the primary process includes a step 22 in which the first FCRL 14a is printed on the substrate 12, a step 24 in which the first conductive layer 16a is applied, a step 26 in which a first dielectric layer 18a is applied, a step 28 in which the second FCRL 14b is applied, and a step 30 in which the second conductive layer 16b is applied. If additional layers are desired (step 32), for each additional layer, in seriatim, the process returns to step 26 and an additional dielectric layer is applied, followed by an additional receiving layer and conductive layer, as desired. If an additional layer is not desired, the process ends (step 34).

If desired, optional steps 40-48 may also be performed. In step 40, the receiving layer is allowed to dry by evaporation prior to application of a conductive layer thereto. In step 42, a gradient layer 17 is applied over the receiving layer 14. In step 44, the gradient layer 17 is dried by heating, as by application of a heat lamp as previously described. In step 46, the dielectric layer is allowed to dry by evaporation prior to application of an FCRL thereto. In step 48, the conductive layer is dried by heating, as by application of a heat lamp as previously described.

It is contemplated, and will be apparent to those skilled in the art from the preceding description and the accompanying drawings that modifications and/or changes may be made in the embodiments of the disclosure. Accordingly, it is expressly intended that the foregoing description and the accompanying drawings are illustrative of exemplary embodiments only, not limiting thereto, and that the true spirit and scope of the present disclosure be determined by reference to the appended claims.

The invention claimed is:

1. A method for providing a printed circuit, the method comprising: ejecting a first fluid composition receiving layer adjacent to at least a portion of a surface of a substrate; ejecting a first conductive layer adjacent to at least a portion of the first receiving layer; ejecting a first dielectric layer adjacent to at least a portion of the first conductive layer; ejecting a second fluid composition receiving layer adjacent to at least a portion of the dielectric layer opposite the first conductive layer; and ejecting a second conductive layer adjacent to at least a portion of the second receiving layer.

2. The method of claim 1, further comprising: ejecting a second dielectric layer adjacent to at least a portion of the second conductive layer; and ejecting a third fluid composition receiving layer adjacent to at least a portion of the second dielectric layer; and ejecting a third conductive layer adjacent to at least a portion of the third receiving layer.

3. The method of claim 1, wherein the fluids for each layer are applied using a micro-fluid ejection device.

4. The method of claim 1, further comprising drying the first receiving layer prior to ejecting the first conductive layer.

5. The method of claim 1, further comprising ejecting a gradient layer adjacent to at least a portion of the first receiving layer prior to ejecting the first conductive layer, wherein the gradient layer is applied by substantially simultaneously ejecting a portion of a fluid used to provide the first receiving layer and a portion of a fluid used to provide the first conductive layer.

6. The method of claim 1, further comprising heating the first conductive layer prior to application of the first dielectric layer thereto.

7. The method of claim 1, further comprising drying the first dielectric layer prior to application of the second conductive layer thereto.

8. The method of claim 1, further comprising drying the second receiving layer prior to application of the second conductive layer thereto.

9. The method of claim 1, further comprising heating the second conductive layer after application thereof.

* * * * *